United States Patent [19]

Sharma et al.

[11] Patent Number: 5,483,094
[45] Date of Patent: Jan. 9, 1996

[54] ELECTRICALLY PROGRAMMABLE READ-ONLY MEMORY CELL

[75] Inventors: Umesh Sharma; Hisao Kawasaki, both of Austin, Tex.

[73] Assignee: Motorola, Inc., Schaumburg, Ill.

[21] Appl. No.: 312,371

[22] Filed: Sep. 26, 1994

Related U.S. Application Data

[62] Division of Ser. No. 124,171, Sep. 20, 1993, Pat. No. 5,382,540.
[51] Int. Cl.$^6$ .......................... H01L 29/68; H01L 21/265
[52] U.S. Cl. .......................... 257/316; 257/322; 257/329; 257/334; 257/401
[58] Field of Search .......................... 257/314, 315, 257/313, 316, 322, 330, 328, 334, 329, 401; 437/42, 43

[56] References Cited

U.S. PATENT DOCUMENTS

| | | | |
|---|---|---|---|
| 4,530,149 | 7/1985 | Jastrzebski et al. | 29/571 |
| 4,908,326 | 3/1990 | Ma et al. | 437/44 |
| 5,017,977 | 5/1991 | Richardson | 357/23.5 |
| 5,078,498 | 1/1992 | Kadakia et al. | 257/316 |
| 5,106,775 | 4/1992 | Kaga et al. | 437/52 |
| 5,135,879 | 8/1992 | Richardson | 437/43 |
| 5,141,886 | 8/1992 | Mori | 437/43 |
| 5,180,680 | 1/1993 | Yang | 437/38 |
| 5,196,722 | 3/1993 | Bergendahl et al. | 257/304 |
| 5,208,172 | 5/1993 | Fitch et al. | 437/40 |
| 5,316,962 | 5/1994 | Matsuo et al. | 437/52 |
| 5,350,937 | 9/1994 | Yamazaki et al. | 257/314 |
| 5,414,287 | 5/1995 | Hong | 257/316 |

FOREIGN PATENT DOCUMENTS

| | | | |
|---|---|---|---|
| 4-192565 | 7/1992 | Japan | 257/315 |

OTHER PUBLICATIONS

IBM Technical Disclosure Bulletin "Vertical EEPROM Cell"]vol. 35 No. 4B Sep. 1992 p. 130.
Takato, et al; "Impact of Surrounding Gate Transistor (SGT) for Ultra–High–Density LSI's"; IEEE Transactions On Electron Devices; vol. 38, No. 3, pp. 573–577 (1991).
Pein, et al.; "A 3–D Sidewall Flash EPROM Cell and Memory Array"; IEEE Electron Device Ltrs.; vol. 14, No. 8, pp. 415 . 417 (Aug. 1993).

*Primary Examiner*—Donald L. Monin
*Attorney, Agent, or Firm*—George R. Meyer

[57] ABSTRACT

An electrically programmable read-only memory cell includes a single crystal silicon pillar having the active region of the memory cell. A memory array of the cells may be configured to act as an EPROM array, an EEPROM array, or a flash EEPROM array. A silicon spacer lies adjacent to each of the silicon pillars and acts as a floating gate for its particular memory cell. A memory cell may have a cell area that is less than one square micron. In an EPROM or a flash EEPROM array, no field isolation is required between the memory cells within the array. Processes for forming the memory cells and the memory array are disclosed.

22 Claims, 5 Drawing Sheets

ELECTRICALLY PROGRAMMABLE READ-ONLY MEMORY CELL

This is a divisional of patent application Ser. No. 08/124,171, filed Sep. 20, 1993, now U.S. Pat. No. 5,382,540.

FIELD OF THE INVENTION

The present invention relates to the field of semiconductor devices, and in particular, to semiconductor devices having an array of electrically programmable read-only memory cells.

BACKGROUND OF THE INVENTION

A semiconductor device may include a memory array having a plurality of memory cells. The memory array may act as an electrically programmable read-only memory (EPROM) array, an electrically erasable and electrically programmable read-only memory (EEPROM) array, or a flash electrically erasable and electrically programmable read-only memory (flash EEPROM) array. Memory cells within a memory array that acts as an EPROM array, an EEPROM array, or a flash EEPROM array include electrically programmable read-only memory cells. Memory cells within a memory array that acts as an EEPROM array or a flash EEPROM array are electrically erasable, too. A difference between an EEPROM array and a flash EEPROM array is that the former typically has a memory array with memory cells that are individually erased (one cell at a time) and the latter typically has a memory array with memory cells, wherein a plurality of memory cells are erased simultaneously (during the same erasing sequence).

Many of memory cells within any of these memory arrays each include only one transistor having an active region, a floating gate, and a control gate. As used in this specification, the active region of a memory cell is the combination of the regions that act as the source, channel, and drain regions for the memory cell. Prior art memory cells typically occupy more than one square micron even when the minimum feature size is about 0.5 micron because the source region or the drain region lies adjacent to a side of the channel region.

An active region may include a silicon pillar formed by a trench etch of a silicon substrate. Formation of a memory cell using the trench etch is problematic because endpoint detection cannot be used to signal the end of the etch. Also, any loading effects during the etch may cause the height of the silicon pillars to vary from one device to another and possible between memory cells within the same device.

SUMMARY OF THE INVENTION

The present invention includes an electrically programmable read-only memory cell comprising a substrate, a first doped region, a first insulating layer, a semiconductor pillar, a first dielectric layer, a spacer, a second dielectric layer, a conductive member, and an interconnect. The substrate has a primary surface, and the first doped region lies at the primary surface of the substrate. The first insulating layer overlies the first doped region and includes an opening. The semiconductor pillar overlies the first doped region and extends therefrom. The semiconductor pillar includes a second doped region, a central region, and a third doped region,. The second doped region overlies the first doped region, the central region lies only on the second doped region, and the third doped region lies on the central region. The first dielectric layer lies adjacent to a side of the

2 semiconductor pillar, and the spacer lies adjacent to the first dielectric layer on the side of the first dielectric layer that is opposite the side that the semiconductor pillar lies. The second dielectric layer lies adjacent to the spacer and includes an opening over the third doped region. The conductive member lies adjacent to the second dielectric layer and includes an opening that overlies the opening in the second dielectric layer. The interconnect is electrically connected to the third doped region. The substrate and the central region have a first conductivity type, and the first, second, and third doped regions have a second conductivity type that is opposite the first conductivity type. The present invention further includes a memory array of memory cells and processes for forming the memory cell and memory array.

Other features and advantages of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements, and in which.

DETAILED DESCRIPTION OF EMBODIMENTS

The present invention includes a memory cell that has a single crystal silicon pillar formed over a buried layer or doped region. The invention may be particularly useful for making EPROM, EEPROM, or flash EEPROM arrays within semiconductor devices. Embodiments of the present invention are described in more detail below. The present invention is not limited to the embodiments described.

Selective Silicon Pillar Flash EEPROM Array

A memory array that acts as a flash EEPROM array includes a plurality of memory cells. The memory cells are formed using silicon pillars that are selectively grown from a substrate. Details for forming the memory cells are described below.

Figure 1:
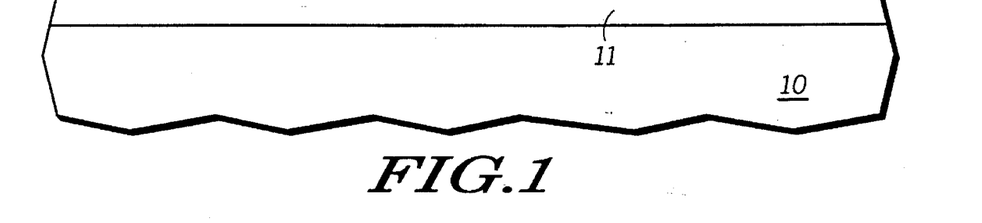
FIG. 1 includes a cross-sectional view of a portion of a substrate including an $N^+$ buried layer.

FIG. 1 includes a cross-sectional view of a portion of a substrate 10 that includes an $N^+$ buried layer 11 that is selectively formed from a portion of the substrate 10. The $N^+$ buried layer 11 is actually a doped region formed from a portion of the substrate. In this embodiment, the entire memory array includes the buffed layer 11 because the memory array being formed will act as a flash EEPROM array. The buried layer 11 may include one or more n-type dopants, such as phosphorus, arsenic, and the like. If the memory cells are to be erased by Fowler-Nordheim tunneling, the buried layer 11 may be graded to reduce the likelihood of a junction breakdown between the buried layer 11 and the substrate 10 during erasing. If the buried layer 11 has a graded junction, it is formed using a conventional method. Field isolation regions (not shown) lie outside the memory array and are used to electrically isolate the memory array and peripheral circuits of the memory device from one another.

Figure 2:
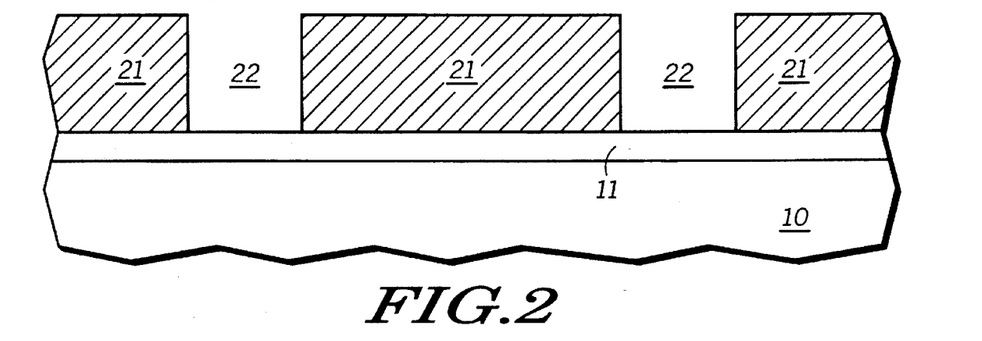
FIG. 2 includes a cross-sectional view of the substrate of FIG. 1 after a patterned insulating layer has been formed over the $N^+$ buried layer.

A first insulating layer 21 is formed over the buried layer 11 and patterned to include openings 22 as shown in FIG. 2. The thickness of the first insulating layer should be about at thick as subsequently formed silicon pillars. In this embodiment, the first insulating layer is about 8000 angstroms thick.

Figure 3:
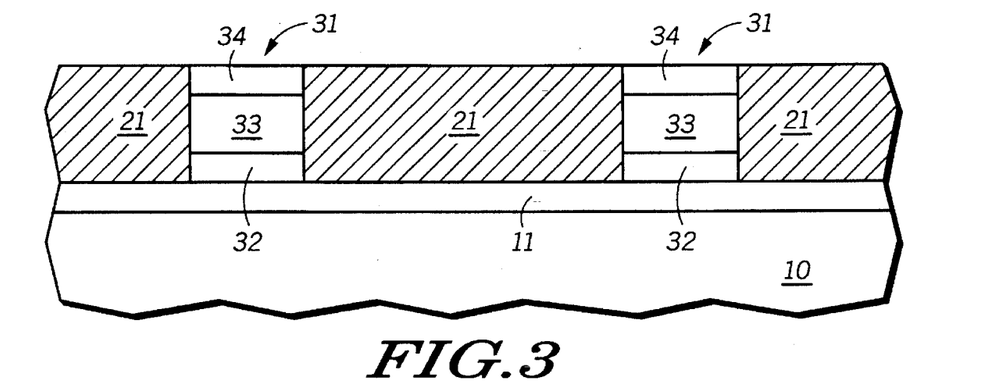
FIG. 3 includes a cross-sectional view of the substrate of FIG. 2 after silicon pillars have been formed within openings of the patterned first insulating layer.

Silicon pillars 31 are selectively and epitaxially grown from exposed portions of the buried layer 11 lying at the bottoms of the openings 22 as shown in FIG. 3. Each silicon pillar 31 includes a lower doped region 32 that acts as part of the source region for the memory cell, a central region 33 that acts as the channel region for the memory cell, and an upper doped region 34 that acts as the drain region for the memory cell. The regions 32 and 34 are n-type doped, and the central region 33 is p-type doped. The combination of the regions 32–34 within the silicon pillars 31 acts as the active region for the memory cell. The doping within the silicon pillars may be performed using in-situ doping that allows more flexibility in the doping levels within the regions 32–34. Many types of cells are erased by Fowler-Nordheim tunneling while a control gate is at about ground potential and a source region is at a potential of about 12 volts. The in-situ doping can be used to grade the doping concentration of the lower region 32 to lessen the likelihood that the junction between the lower doped region 32 and central region 33 breaks down. Also, the doping of the central region 33 may be graded, so that the doping concentration increases with the distance from the substrate 10. A higher doping concentration within the central region 33 near the upper doped region 34 causes a higher electrical field to be formed near the upper doped region 34 if the memory cell is programmed by hot electron injection.

In this embodiment, the silicon pillars 31 are formed using a conventional method. The formation may be performed by low pressure chemical vapor deposition using a silicon hydride (silane, disilane, or the like), a silicon-chlorine compound (dichlorosilane or the like), or a combination thereof. The temperature of the epitaxial growth depend in part on the gaseous silicon source. For example, if dichlorosilane is used, the temperature may be between 750–900 degrees Celsius. In general, the temperature of the epitaxial growth increases as the relative ratio of chlorine atoms to silicon atoms increases within the molecule of the silicon source gas. The lower and upper doped regions 32 and 34 are doped with an n-type dopant. The n-type dopant may be incorporated by using a gas containing an n-type dopant, such as phosphine, arsine, and the like. The central regions 33 are doped with a p-type dopant. The p-type dopant may be incorporated by using a gas containing p-type dopant, such as diborane, boron trichloride, and the like. The doping levels within regions 32–34 are determined in part by the relative flow rate between the silicon source and the dopant gas. One skilled in the art can adjust the relative gas flow rates to obtain the desired doping concentrations.

Each of the lower and upper doped regions 32 and 34 has a thickness of about 2000 angstroms and a doping concentration no less than about 1E19 ions per cubic centimeter, and each of the central regions 33 has a thickness of about 4000 angstroms and a doping concentration no higher than about 1E17 ions per cubic centimeter.

After forming the silicon pillars, the patterned insulating layer 21 is partially etched, so that about 2000 angstroms of the patterned insulating layer 21 remains. Another etch will be subsequently performed that removes more of the patterned insulating layer 21, so that the patterned insulating layer 21 will have a thickness of about 1500 angstroms in locations immediately adjacent to the lower doped region 32.

At a minimum, the etches that remove part of the patterned insulating layer 21 must be enough such that a portion of the lower doped region 32 lies above the remaining portion of the patterned insulating layer 21. If too much of the patterned insulating layer 21 is removed, an electrical short may be formed or too much capacitive coupling may exist between the buried layer 11 and a subsequently formed floating gate or control gate. The etch to remove a portion of the patterned insulating layer 21 may be performed using a conventional method, but some care must be used to insure that the proper amount of layer 21 is removed.

After the etch step has been performed, the substrate 10 and pillars 31 are annealed to activate dopants within the pillars 31 and to repair crystal damage, if any, to the pillars 31. A sacrificial oxide layer is grown from the pillars 31 to a thickness of about 400 angstroms and is removed using a conventional method. The etch to remove the sacrificial oxide layer removes about 500 angstroms of the patterned insulating layer 21. The thickness of the patterned insulating layer 21 after the removal is about 1500 angstroms. A thicker sacrificial oxide layer may be formed, but less of the patterned insulating layer 21 should be removed prior to the sacrificial oxidation if a thicker sacrificial oxide layer is to be formed. One skilled in the art can chose how much of the patterned insulating layer 21 is to be removed prior to the sacrificial oxidation and how thick of a sacrificial layer is to be formed.

Figure 4:
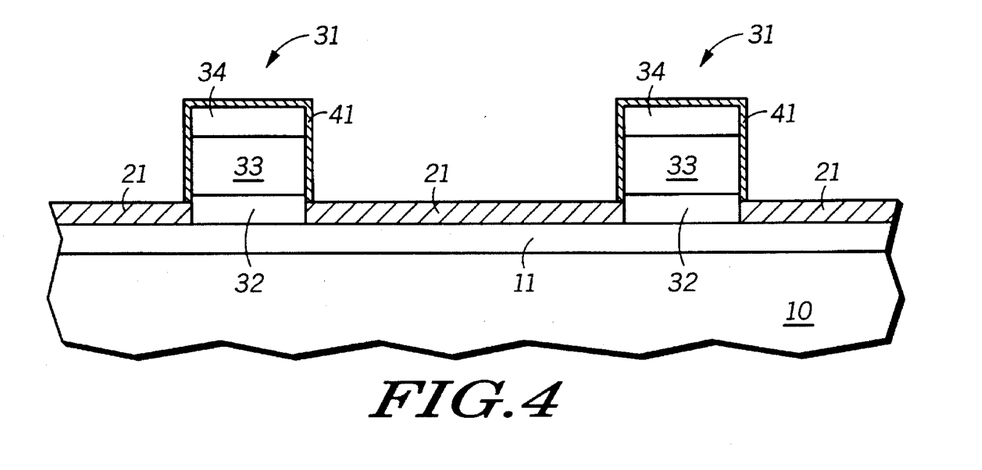
FIG. 4 includes a cross-sectional view of the substrate of FIG. 3 after a portion of the patterned first insulating layer has been removed and a tunnel dielectric layer has been formed adjacent to the silicon pillars.

A tunnel dielectric layer 41 is formed along the exposed edges of the pillars 31 as shown in FIG. 4. The tunnel dielectric layer 41 is formed by thermally oxidizing part of the pillars 31.

Figure 5:
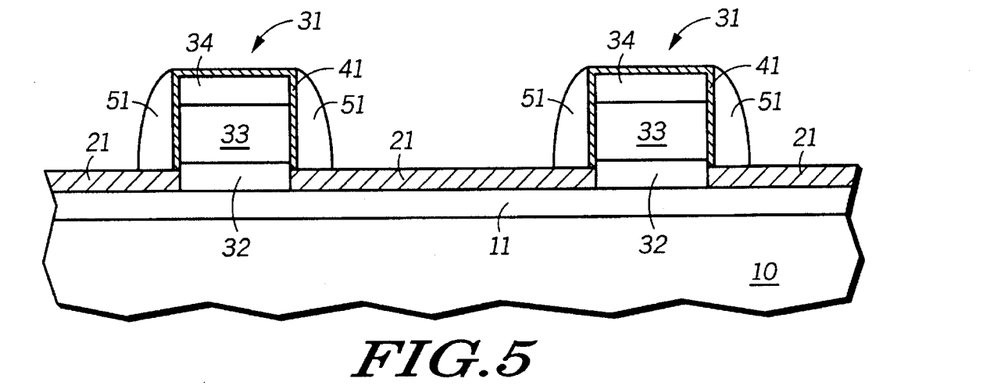
FIG. 5 includes a cross-sectional view of the substrate of FIG. 4 after spacers have been formed adjacent to the tunnel dielectric layer.

Silicon spacers 51 are formed adjacent to the tunnel dielectric layer 41 and the patterned insulating layer 21 as shown in FIG. 5. The silicon spacers 51 act as the floating gates of the cells. The silicon spacers 51 surround the sides of the silicon pillars 31. The silicon spacers 51 may be formed by depositing a layer of polycrystalline silicon (polysilicon) or amorphous silicon to a thickness of about 500 angstroms thick and subsequently doping the deposited layer to make it conductive. Alternatively, an in-situ doped layer of polysilicon or amorphous silicon may be deposited to a thickness of about 500 angstroms. Regardless of how the silicon layer is deposited and doped, the deposited layer is then anisotropically etched using a conventional method to form the silicon spacers 51. The silicon spacer 51 is formed such that it is adjacent to regions 32–34 of the silicon pillars 31.

Figure 6:
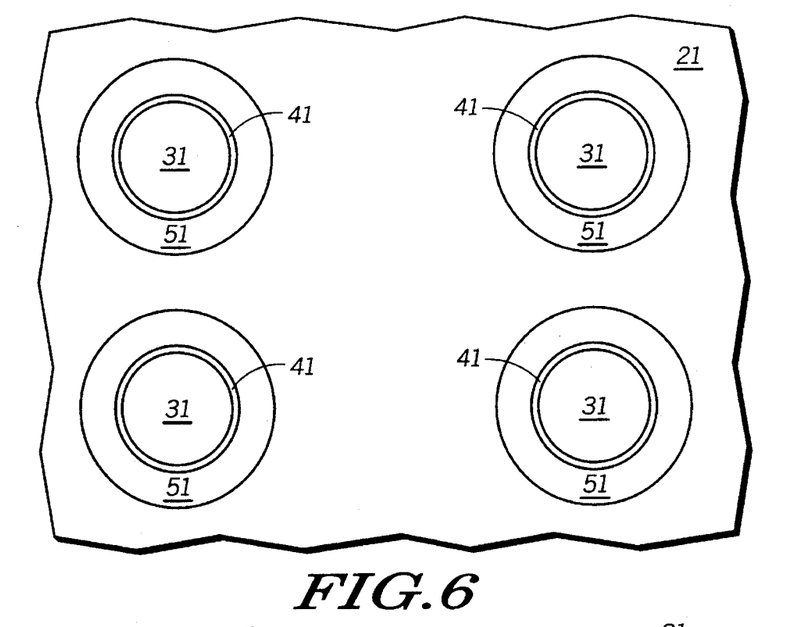
FIG. 6 includes a plan view of a portion of the substrate showing the positional relationship of the memory cells of FIG. 5 and elements within those memory cells.

FIG. 6 includes a plan view of a portion of the memory array at this point in the process. Each memory cell appears to be a set of concentric circles. The positional relationships between the silicon pillars 31, tunnel dielectric layer 41, and silicon spacers 51 are illustrated in FIG. 6. Each memory cell is surrounded by the remaining patterned insulation layer 21. The buffed layer 11 and the substrate 10 underlie the remaining patterned insulating layer 21 and the silicon pillars 31. A portion of the tunnel dielectric layer 41 overlies the pillars 31 but is not shown in FIG. 6 for simplicity.

Figure 7:
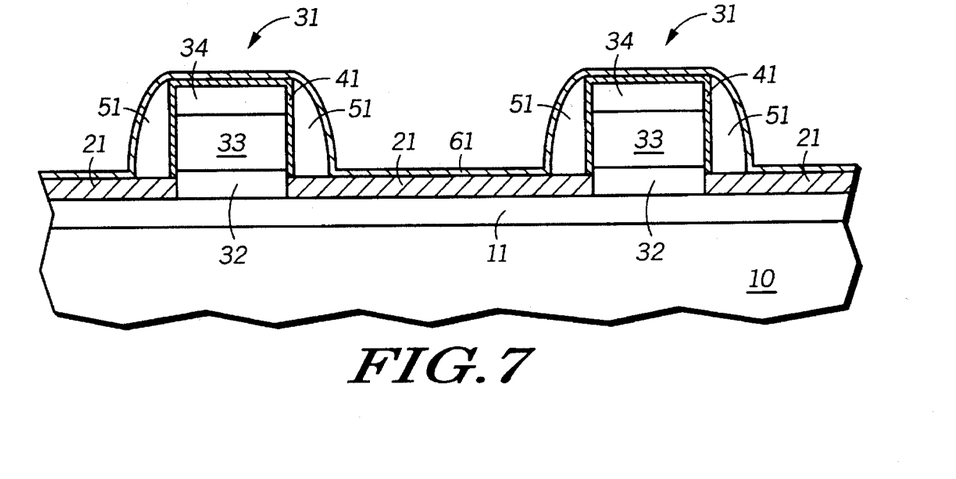
FIG. 7 includes a cross-sectional view of the substrate of FIG. 5 after an intergate dielectric layer has been foraged adjacent to the spacers.

An intergate dielectric layer 61 is formed adjacent to the silicon spacers 51 as shown in FIG. 7. The intergate dielectric layer 61 is formed by depositing a silicon dioxide layer over the substrate 10, depositing a silicon nitride layer over the silicon dioxide layer, and oxidizing a portion of the silicon nitride layer. For simplicity, the intergate dielectric layer 61 is illustrated to be one layer, although it is made up of three layers.

Figure 8:
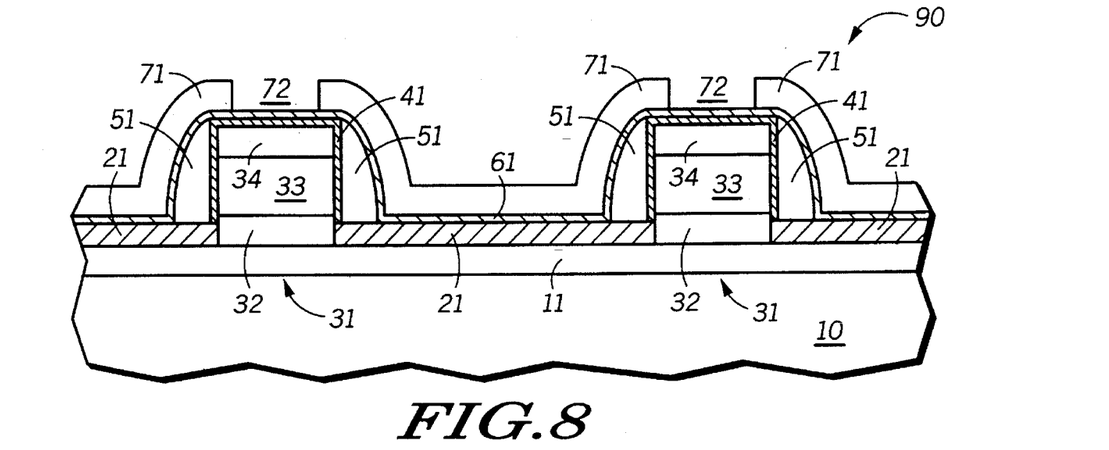
FIG. 8 includes a cross-sectional view of the substrate of FIG. 7 after conductive members have been formed over the intergate dielectric layer.

Conductive members 71 are formed adjacent to intergate layer 61 as shown in FIG. 8. The conductive members 71 act as the control gates for the cells. The conductive members 71 are formed by depositing a layer of polysilicon or amorphous silicon and either in-situ doping or subsequently doping the layer to make it conductive. The conductive members 71 act as the control gates for their respective memory cells and act as word lines for the memory array. While the conductive members 71 are being formed, openings 72 within the layer are also being formed over the upper doped regions 34 for subsequent electrical contacts to the upper doped regions 34. The width of each opening 72 is about 0.7 micron. The patterning is performed using a conventional method and stops on the intergate dielectric layer 61.

Figure 9:
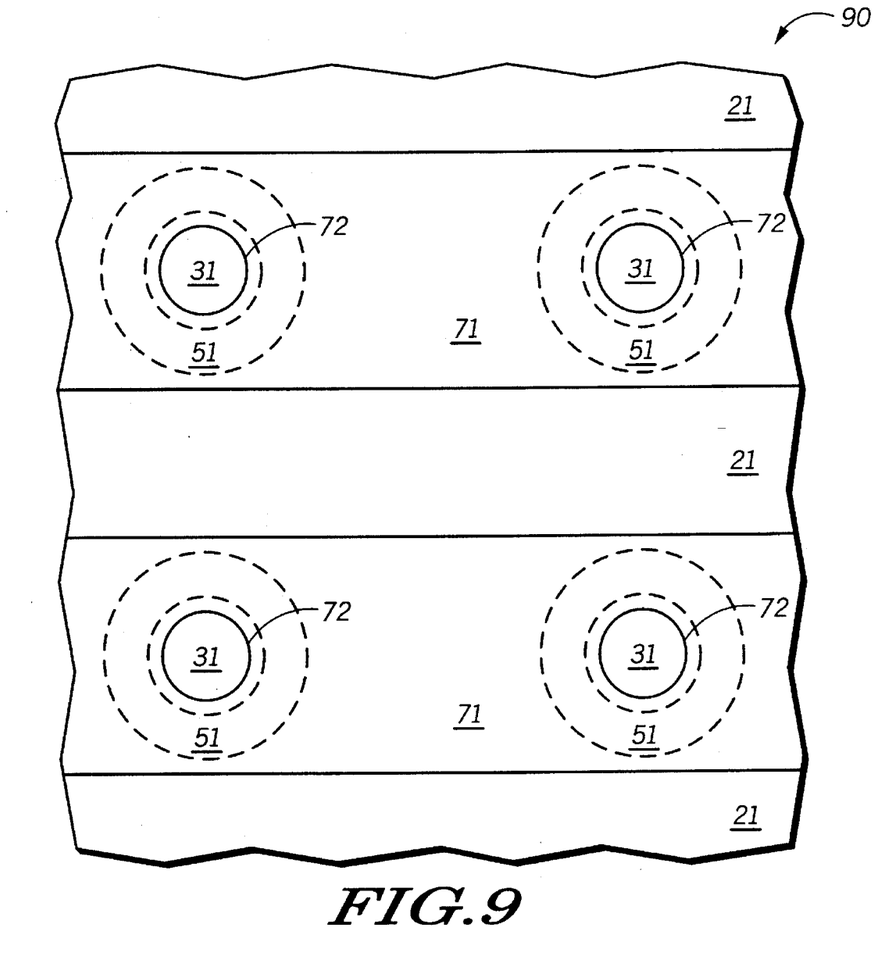
FIG. 9 includes a plan view of a portion of the substrate showing the positional relationship of the memory cells of FIG. 8 and elements within those memory cells.

FIG. 9 includes a plan view of a portion of the memory array 90 at this point in the process. The conductive members 71 and generally look like strips. FIG. 9 includes two dashed lines for each memory cell. The outer clashed line of each memory cell represents where the outer edge of the silicon spacer 51 (edge of the silicon spacer 51 further from the silicon pillar 31), and the inner dashed line represents where the inner edge of the silicon spacer 51 (edge of the silicon spacer 51 closer to the silicon pillar 31). Dashed lines are used to indicate that the silicon spacers 51 underlie the conductive members 71. Capacitive coupling between the conductive members 71 and silicon spacers 51 should be good because the strips 71 surround the sides of the silicon spacers 51. The silicon pillars 31 underlie the openings 72. It is noted that the tunnel dielectric layer 41 and the intergate dielectric layer 61 also underlie openings 72, but are not shown in FIG. 9 for simplicity.

Figure 10:
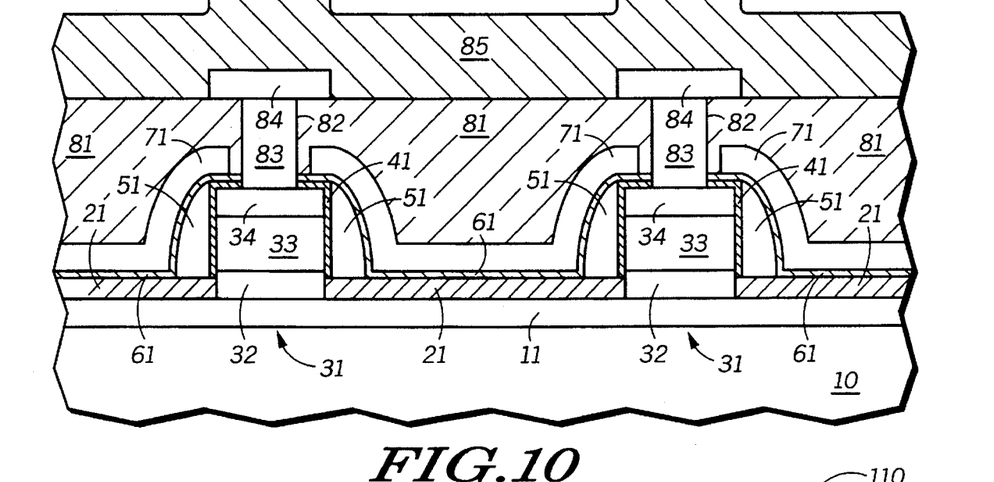
FIG. 10 includes a cross-sectional view of the substrate of FIG. 8 after a substantially completed device has been formed.

Additional processing steps are performed to form a substantially completed device as shown in FIG. 10. A second insulating layer 81 is formed over the substrate 10 and within the opening 72. The second insulating layer 81 is patterned to form openings 82 that extend to the upper doped regions 34. The openings 82 are each about 0.5 micron in width. Conductive plugs 83 are formed within the openings 82, and interconnects 84 are formed over the conductive plugs 83. A passivation layer 85 is formed over the second insulating layer 81 and the interconnects 84.

The interconnects 84 act as bit lines for the memory array. The length of the interconnects 84 are generally oriented such that they are generally perpendicular to the lengths of the conductive members 71. Electrical connections to other portions of the cells are not shown, but are present. For example, connections for to the buried layer 11 and conductive members 71 may be made near at least one edge of the memory array. Additional insulating layers, vias, and interconnects may be made, if needed. The second insulating layer 81, openings 82, conductive plugs 83, interconnects 84, and passivation layer 85 are formed using conventional methods.

Programming and Erasing

The memory cells formed by the embodiment previously described may be programmed and erased using conventional methods. A cell may be programmed by hot electron injection by placing a conductive member 71 for the cell at a potential of about 5–7 volts, the upper doped region 34 for the cell at a potential of about 5–8 volts, and the lower doped regions 32 are at about ground potential.

A plurality of cells may be erased simultaneously because a flash EEPROM may is formed. In the embodiment previously described, cells may be erased by Fowler-Nordheim tunnel by maintaining about a 10–15 volt difference between the conductive member 71 and the lower doped regions 32 for the cells that are associated with that conductive member 71. For example, a conductive member 71 is at about ground potential, the lower doped regions 32 are at a potential of about 12 volts, and the upper doped regions 34 are disconnected. The erasing may also be performed when the conductive member 71 is at a potential of about −6 volts, the lower doped regions 32 are at a potential of about 6 volts, and the upper doped regions 34 are disconnected. The flash erasing causes all of the cells along a conductive member 71 to be erased simultaneously. If a conductive member 71 acts as a control gate for about 1000 cells, then all 1000 cells are erased simultaneously. If the entire memory array is to be erased simultaneously, then all of the conductive members 71 are activated (placed at the about the same proper potential for erasing). In the previously mentioned erasing schemes, all of the conductive members 71 would be at about ground potential, or all of the conductive members 71 would be at a potential of about −6 volts if all of the memory cells of the memory array are to be erased simultaneously. One skilled in the art can design the memory array to erase any portion of the array that he or she desires.

Other types of programming or erasing methods may be performed. In addition, conventional post-erasing methods may be used. These other post-erasing methods are called "repairing tail bits," "self convergence erasing," or the like. The programming, erasing, and post-erasing methods mentioned are just examples of the types of programming, erasing, and post-erasing methods that may be used. The methods described are not intended to limit the invention.

Benefits of the Embodiment

Many benefits are seen with the embodiment described above. The embodiment forms a memory cell occupying an area of about 0.8 square micron when the minimum feature size is about 0.5 micron.

In general, the minimum cell size for a circular shaped cell may be calculated using the formula below:

$$A=\pi(r_{eff})^2$$

where,

A is the area occupied by the cell; and $r_{eff}$ is the effective radius of the cell.

The effective radius of a memory cell may be calculated using the formula below:

$$r_{eff}=0.5*(F+tol_1+tol_2)+th_{td}+ws$$

where,

F is the minimum feature size;

$tol_1$ is the total alignment tolerance between the silicon pillars 31 and the openings 72;

$tol_2$ is the total alignment tolerance between the openings 72 and the openings 82;

$th_{td}$ is the thickness of the tunnel dielectric layer 41; and $w_s$ is the width of the base of one of the spacers 51.

The equation for $r_{eff}$ may be simplified by making a couple of assumptions. First, the width of the base of the spacers 51 is about the same as the thickness of the layer from which the spacers 51 are formed. Also, the thickness of the tunnel dielectric layer 41 adjacent to the central regions 33 is typically less than a fifth of the thickness of the layer from which the spacers 51 are formed. Therefore, $$r_{eff}=0.5*(F+tol_1+tol_2)+th_s$$

where, $th_s$ is the thickness of the layer from which the spacers 51 are formed.

In the previous embodiment, the minimum feature size is 0.5 micron, the total alignment tolerance, is 0.2 micron for each layer (an alignment tolerance from one layer to another is assumed to be plus or minus 0.1 micron for this example), and the spacers 51 are formed from a layer that is 500 angstroms (0.05 micron) thick. Therefore, the effective radius is about 0.5 micron. Obviously, the minimum cell area may change according to changes in the minimum feature size, alignment tolerances, and thickness of the layer from which the spacers 51 are formed. Typically, the memory cell area is no more than four times the effective radius of the memory cell. Many prior art memory cells for memory arrays that act as flash EEPROM arrays occupy areas greater than this because most of the source and/or drain regions lie adjacent to the sides of the channel region. Unlike those cells, the central regions 33 that act as the channel regions of the memory cells of the embodiment described overlie only the lower doped regions 32 that act as the source regions of the memory cells. The upper doped regions 34 overlie the central regions 33 and act as the drain regions for the memory cells. Therefore, the source and drain regions lie above and below the channel region as opposed to lying adjacent to the sides of the channel region.

Another benefits is the relative ease in forming the memory cell. Many of the individual steps are performed using conventional methods. One skilled in the art appreciates that the cells may be formed without having to obtain new equipment or developing new process steps. Along the same lines, the programming and erasing methods are not expected to cause any problems.

The cells described in the embodiment above have active regions that are formed using epitaxially grown silicon. The active regions of the cells are single crystal silicon and not polysilicon or amorphous silicon. Therefore, the transistor characteristics are expected to be better than if the active regions would be made from polysilicon or amorphous silicon.

The silicon pillars 31 are not formed by etching. If a silicon trench etch was used to form the silicon pillars, the lower doped regions 32 cannot be formed. Doped regions that act as the source regions for the cell are located adjacent to the pillars. Therefore, a larger memory cell is required. Another problem with a silicon trench etch is that there is no endpoint detection for the etch. The etch is performed more or less by guessing how deep the trench is to be formed. The etch may be complicated by loading effects that may cause etch nonuniformity problems. Because the embodiment previously described forms the silicon pillars by epitaxially growing silicon, complications related to a silicon trench etch are avoided.

Fabricating Options

Many fabricating options exist for forming the memory cells. All of the conductivity types may be reversed. Also, other semiconductor materials (i.e. germanium, silicon germanium, or the like) may be used in place of silicon. Insulating, dielectric, or passivation layers may include one or more layers of silicon dioxide, silicon nitride, silicon oxynitride, or the like. The insulating or passivation layers may or may not include dopants, such as phosphorus, boron, or the like. The silicon spacers 51 may be replaced by or used in conjunction with other materials including metals, metal-containing compounds, or silicon-containing compounds. The conductive members 71 and conductive plugs 83 may include metals, metal-containing compounds, or silicon-containing compounds. The interconnects 94 may include metals or metal-containing compounds.

The shapes of the silicon pillars 31 as seen from a top view of the cell appear to be circular. The actual shape of each of the silicon pillars 31 may also include rectangular, oval, oblong, or the like.

Specific thicknesses, widths, and doping levels appear in the embodiment described above. The specific thicknesses, widths, and doping levels, may be varied from those given. For example, the central regions 33 are about 4000 angstroms thick. Therefore, each channel length of the cells is about 0.4 micron long. If a longer or shorter channel length is desired, the thickness of the central region 33 should be adjusted accordingly. The thicknesses of the lower and upper doped regions 32 and 34 may be changed, but the thickness of the lower doped regions 32 must be such that the silicon spacers 51 lie adjacent to at least a portion of the lower doped regions 32 as previously described. The thickness of the sacrificial oxide layer has concerns also related to the positional relationship between the lower doped regions 32 and the silicon spacers 51 as described above.

The thickness of the lower doped regions 32 may be changed as long as each of the silicon spacers 51 spans all of the central region 33 and at least part of the lower and upper doped regions 32 and 34 for its specific memory cell. The positional relationship of the lower doped regions 32 and silicon spacers 51 has already been discussed. The thickness of the upper doped regions 34 may be adjusted more freely than the lower doped regions 32 and the central regions 33. The memory cells may operate even if the upper doped regions 34 are only a few hundred angstroms thick. An upper thickness limit for the upper doped regions 34 is not known. Other considerations, such as too high of an aspect ratio of the openings in the patterned first insulating layer 21 or the step height or coverage problems may limit the thickness of the upper doped regions 34. The aspect ratio is the ratio of a depth of an opening to the width of that opening. If the aspect ratio is too high, proper formation of openings 22 may be difficult. Step height or coverage problems may cause voids within a subsequently deposited layer or undesired electrical coupling to other parts of the device. In general, the upper doped regions 34 should not be more than one micron thick.

The silicon pillars 31 may be formed with silicon grown within the openings 72 and continuing until the silicon overflows the opening and extends slightly onto the upper surface of the patterned first insulating layer 21. If silicon from the pillar formation extends onto the patterned first insulating layer 21, the portion of the silicon lying on the first insulating layer 21 may be reproved by etching or polishing the substrate such that all of the silicon pillar lies within the openings 22.

The silicon spacers 51 should have a resistivity no greater than about 0.05 ohm·centimeter and is normally between about 0.008–0.02 ohm·centimeter. In forming the silicon spacers 51, the thickness of the silicon layer that forms the silicon spacers 51 is not limited to 500 angstroms. The thickness of the layer is typically between about 100–2000 angstroms. Below 100 angstroms, the silicon spacer 51, which act as floating gates, may not be able to store enough charge. Above 2000 angstroms, the silicon spacers 51 cause the cell area to be too large. If the silicon spacers 51 in the embodiment described above were formed using a 2000 angstrom thick layer of silicon instead of 500 angstroms, the cell area would be about 1.5 square microns, which is almost double the cell area of the previous embodiment described (0.8 square micron).

The widths of the silicon pillars 31, openings 72, and openings 82 are related to one another. Openings 72 should not be any wider than the width of the silicon pillars 31. If the openings 72 are too wide, then the conductive members 71 may have insufficient coupling to the silicon spacers 51. If the openings 72 are too narrow or openings 82 are too wide, then an electrical short may be formed between the upper doped regions 34 and the conductive members 71 via the conductive plugs 83. In other words, a bit line and a word line would be electrically shorted to each other. Assuming that one layer has an alignment tolerance of plus or minus 0.1 micron to another layer, the silicon pillars 32 should be at least 0.2 micron wider than openings 72, and openings 72 should be at least 0.2 micron wider than openings 82. One skilled in the art may adjust the widths in accordance with the alignment tolerances of lithographic methods used in patterning.

Conductive plugs 83 may not be needed with other embodiments. If the material for the interconnects 84 can contact the upper doped regions 34 without any electrical openings being formed along the walls of the openings 82, then conductive plugs 83 are not needed. In this case, the interconnects 84 may contact the upper doped regions 34 or a barrier layer (not shown) that may be formed between the interconnects 84 and the upper doped regions 34.

EEPROM and EPROM Arrays

A memory array that acts as an EEPROM array includes a plurality of memory cells that can be individually erased. Similar to the embodiment described above, the memory cells are formed using silicon pillars that are selectively and epitaxially grown from a substrate. Details for forming the memory cells appear below.

Figure 11:
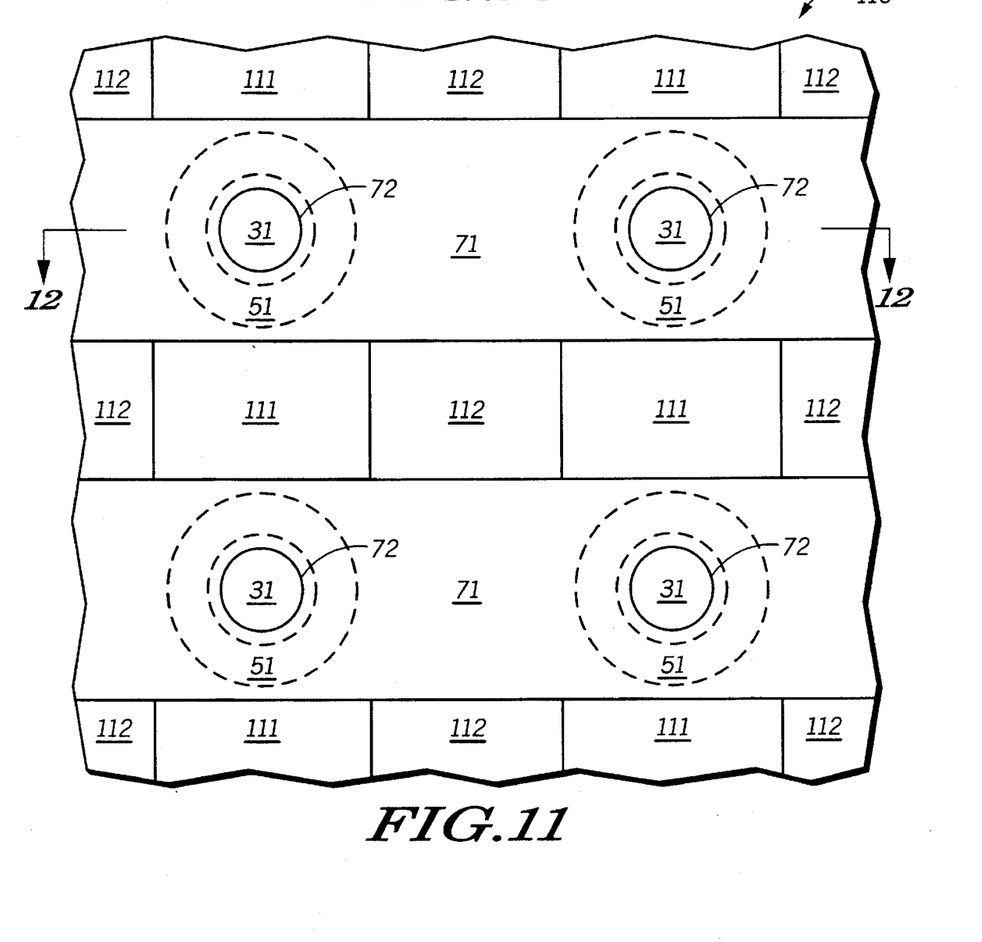
FIG. 11 includes a plan view of a portion of a substrate showing the positional relationship of the memory cells and elements within the memory cells of another embodiment of the present invention.

FIG. 11 includes a plan view of a memory array 110 after conductive members 71 have been formed. The layout of the memory array 110 is similar to the memory array 90 except that the memory array 110 has field isolation regions 112 and strips of $N^+$ regions 111 that are formed from a portion of the substrate 10 (not shown). The lengths of the conductive members 71 are generally oriented perpendicular to the lengths of the $N^+$ regions 111. For simplicity, the first patterned layer 21, tunnel dielectric layer 41, intergate layer 61 are not shown in FIG. 11.

FIG. 11 includes two dashed lines for each memory cell. The outer dashed line of each memory cell represents where the outer edge of the silicon spacer 51 (edge of the silicon spacer 51 further from the silicon pillar 31 ), and the inner dashed line represents where the inner edge of the silicon spacer 51 (edge of the silicon spacer 51 closer to the silicon pillar 31). Dashed lines are used to indicate that the silicon spacers 51 underlie the conductive members 71. Capacitive coupling between the conductive members 71 and silicon spacers 51 should be good because the conductive members 71 surround the sides of the silicon spacers 51. The silicon pillars 31 underlie the opening 72.

Figure 12:
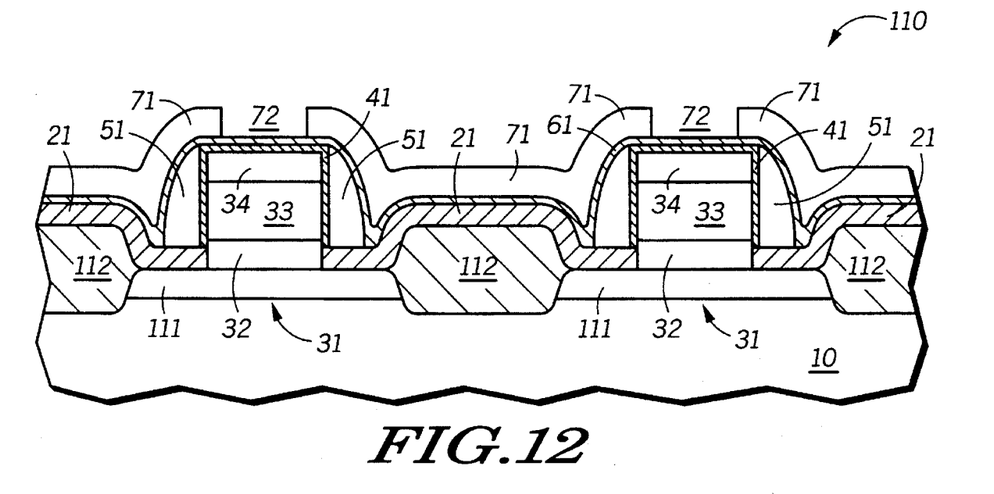
FIG. 12 includes a cross-sectional view of the substrate of FIG. 11 as indicated by the cross sectioning lines shown in FIG. 11.

FIG. 12 includes a cross-sectional view of a portion of the memory array 110 as indicated by the arrows in FIG. 11. FIG. 11 is similar to FIG. 8 except that $N^+$ regions 111 are strips that are separated from one another by field isolation regions 112. FIG. 12 includes many of the items seen in FIG. 8, such as the patterned first insulating layer 21, the silicon pillars 31 including lower doped regions 32, central regions 33, and upper doped regions 34, the tunnel dielectric layer 41, the silicon spacers 51, the intergate dielectric layer 61, the conductive member 71, and openings 72 within the conductive member 71.

Forming the memory array 110 is different from forming the memory array 90. Field isolation regions 112 within the memory array 110 are formed using a conventional field isolation process such as the local oxidation of silicon (LOCOS) process, a modified LOCOS process (polysilicon-buffered LOCOS), or the like. After the field isolation regions 112 are formed, regions of the substrate 10 lying between the field isolation regions 112 are doped with an n-type dopant to form the $N^+$ regions 111. The considerations for forming the $N^+$ regions 111 are similar to forming the buried layer 11. The $N^+$ regions 111 may be formed to have a graded junction if this is desired. The field isolation regions 112 and $N^+$ regions 111 are formed using conventional methods.

The formation of the rest of the layers and elements are similar to the corresponding elements of the memory array that acts as a flash EEPROM array. Just like in the previous embodiments, the lengths of the interconnects 84 (not shown in FIGS. 11 and 12) are formed to be generally perpendicular to the conductive members 71.

Programming the memory cells of the memory array 110 is similar to the programming of the memory cells of the memory array 90. Erasing may be performed similar to the erasing the memory cells of a memory array that acts as a flash EEPROM array with respect to mechanisms and potentials except that only one cell is erased at a time. A conductive member 71 and an N⁺ region 111 are activated (placed at the proper potentials for the erasing to occur). It is noted that lower doped regions 32 lying above an N⁺ region 111 are electrically connected to that N⁺ region 111. All of the upper doped regions 34 and the rest of the conductive members 71 and N⁺ regions 111 are disconnected. The memory cell that lies at the intersection of the activated conductive member 71 and activated N⁺ region 111 is erased. All other cells are not affected by the erasing.

The memory array 110 may be adapted to act as a flash EEPROM array by electrically connecting a plurality of conductive members 71 or a plurality of N⁺ regions 111 together during an erasing sequence. One skilled in the art can design the memory array 110 shown in FIGS. 11 and 12 to act as either a flash EEPROM array or an EEPROM array. Also, the memory cells may act as a one time programmable memory cells of an EPROM array. The memory cells are programmed, but the cells are not erased. Therefore, using one of the memory layouts 90 and 110, one skilled in the art may form a memory array that acts as an EPROM array or a flash EEPROM memory array, and using the memory layout of FIGS. 11 and 12, one skilled in the art may form a memory array that acts as an EPROM array, an EEPROM array, or a flash EEPROM array.

A memory array that acts as an EPROM array includes a plurality of memory cells. The layout for the memory array of EPROM device may be similar to either memory array 90 or memory array 110. The tunnel dielectric layer 41 may be used or replaced by a gate dielectric layer. The gate dielectric layer may be made of the same materials as the tunnel dielectric layer, but the thickness of the gate dielectric layer may be thicker. Usually, the gate dielectric layer is not greater than about 500 angstroms thick, whereas a tunnel dielectric layer is typically less than about 200 angstroms thick. The thicknesses given are the electrically measured thickness of an equivalent silicon dioxide film. One skilled in the art appreciates that electrically measured thicknesses may be used to express a thickness of a layer when it is comprised one or more dielectric materials. In order for the memory array to act as an EPROM array, the cells of the memory array are selectively programmed but never erased.

In any of the above described embodiments, the memory array includes a plurality of memory cells that are oriented in rows and columns. The conductive members 71 correspond to rows, and interconnects 84 correspond to columns. Each row and each column includes only some of the memory cells for the memory array. Only one memory cell within a memory array is associated with each combination of any one conductive member 71 and any one interconnect 84. The layer or region that acts as a source region may be common to all memory cells within the memory array or correspond to a row or column. If a layer or region corresponds to a row or column, the layer or region may be electrically connected to more, less, or the same number of memory cells as the conductive member 71 or interconnect 84 lying over that layer or region.

In the foregoing specification, the invention has been described with reference to specific embodiments thereof. However, it will be evident that various modifications and changes may be made thereto without departing from the broader spirit or scope of the invention as set forth in the appended claims. Accordingly, the specification and drawings are to be regarded in an illustrative rather than a restrictive sense.

What is claimed is:

1. An electrically programmable read-only memory cell comprising:

a substrate having a first conductivity type and a primary surface;

a first doped region having a second conductivity type that is opposite the first conductivity type, wherein the first doped region lies adjacent to the primary surface of the substrate;

a pillar including a semiconductor material and overlying the first doped region and extending therefrom, wherein the pillar includes:
a central region having the first conductivity type, wherein all of the central region overlies the first doped region; and
a second doped region lying on the central region, wherein the second doped region has the second conductivity type;

a first dielectric layer lying adjacent to a side of the pillar;

a spacer lying adjacent to the first dielectric layer, wherein the spacer acts as a floating gate;

a second dielectric layer lying adjacent to the spacer, wherein the second dielectric layer includes an opening that overlies the second doped region;

a conductive member that lies adjacent to the second dielectric layer; and an interconnect that is electrically connected to the second doped region.

2. The memory cell of claim 1, wherein the pillar includes single crystal silicon.

3. The memory cell of claim 1, wherein the central region acts as a channel region and the conductive member acts as a control gate.

4. The memory cell of claim 1, wherein the spacer has a resistivity no greater than 0.05 ohm·centimeter.

5. The memory cell of claim 1, wherein the conductive member includes an opening that overlies the second doped region.

6. The memory cell of claim 1, wherein:

a region of the pillar has a graded doping concentration; and the region is selected from a group consisting of the second doped region and the central region.

7. A memory array that includes a first plurality of electrically programmable read-only memory cells comprising:

a substrate having a first conductivity type and a primary surface;

at least one first doped region having a second conductivity type that is opposite the first conductivity type, wherein the at least one first doped region lies adjacent to the primary surface of the substrate;

pillars including a semiconductor material, wherein:
all of each pillar overlies one of the at least one first doped region;
the pillars include central regions having the first conductivity type; and
the pillars include second doped regions lying on the central regions, wherein the second doped regions have the second conductivity type;

a first dielectric layer lying adjacent to sides of the pillars;

spacers lying adjacent to the first dielectric layer, wherein the spacers act as floating gates;

a second dielectric layer lying adjacent to the spacers;

conductive members lying adjacent to the second dielectric layer; and interconnects that are electrically connected to the second doped regions, wherein lengths of the conductive members are perpendicular to lengths of the interconnects.

8. The memory array of claim 7, wherein a second plurality of memory cells of the first plurality of memory cells may be erased simultaneously.

9. The memory array of claim 7, wherein each of the pillars includes single crystal silicon.

10. The memory array of claim 7, wherein each of the central regions acts as a channel region and each of the conductive members acts as control gates.

11. The memory array of claim 7, wherein the second dielectric layer includes openings that overlie the second doped regions.

12. The memory array of claim 7, wherein the conductive members include openings that overlie the second doped regions.

13. The memory array of claim 7, wherein:
   regions of the pillars have graded doping concentrations; and
   the regions are selected from a group consisting of the second doped regions and the central regions.

14. The memory array of claim 7, wherein the at least one first doped region is a plurality of doped strips lying within the substrate, wherein field isolation regions lie between the doped strips.

15. The memory array of claim 7, wherein:
   the at least one first doped region is electrically connected to the pillars of a second plurality of memory cells and the first doped region acts as a common source region for the second plurality of memory cells;
   one of the conductive members acts as gate electrodes for a third plurality of memory cells and as a word line for the memory array;
   one of the interconnects is electrically connected to the second doped regions of a fourth plurality of memory cells and acts as a bit line for the memory array;
   the second plurality of memory cells includes at least a portion of the first plurality of memory cells; and
   only one memory cell is common to the third and fourth pluralities of memory cells.

16. An electrically programmable read-only memory cell comprising:
   a substrate having a first conductivity type and a primary surface;
   a first doped region having a second conductivity type that is opposite the first conductivity type, wherein the first doped region lies adjacent to the primary surface of the substrate;
   a pillar including a semiconductor material and overlying the first doped region and extending therefrom, wherein the pillar includes:
      a central region having the first conductivity type, wherein all of the central region overlies the first doped region; and
      a second doped region overlying on the central region, wherein the second doped region has the second conductivity type;
   a first dielectric layer lying adjacent to a side of the pillar;
   a spacer lying adjacent to the first dielectric layer and laterally surrounding the central region, wherein the spacer acts as a floating gate;
   a second dielectric layer lying adjacent to the spacer;
   a conductive member that lies adjacent to the second dielectric layer; and
   an interconnect that is electrically connected to the second doped region.

17. The memory cell of claim 16, wherein the pillar includes single crystal silicon.

18. The memory cell of claim 16, wherein the central region acts as a channel region and the conductive member acts as a control gate.

19. The memory cell of claim 16, wherein the second dielectric layer includes an opening that overlies the second doped region.

20. The memory cell of claim 16, wherein the conductive member includes an opening that overlies the second doped region.

21. The memory cell of claim 16, wherein:
   a region of the pillar has a graded doping concentration; and
   the region is selected from a group consisting of the second doped region and the central region.

22. A memory array that includes a first plurality of electrically programmable read-only memory cells comprising:
   a substrate having a first conductivity type and a primary surface;
   at least one first doped region having a second conductivity type that is opposite the first conductivity type, wherein the at least one first doped region lies adjacent to the primary surface of the substrate;
   pillars including a semiconductor material, wherein:
      all of each pillar overlies one of the at least one first doped region;
      the pillars include second doped regions overlying the at least one first doped region, wherein:
         the second doped regions have the second conductivity type; and
         the at least one first doped region is electrically connected to the second doped regions of a second plurality of memory cells;
         the second plurality of memory cells includes at least a portion of the first plurality of memory cells; and
         a combination of the first and second doped regions acts as a common source region for the second plurality of memory cells;
      the pillars include central regions lying only on the second doped regions, wherein the central regions have the first conductivity type; and
      the pillars include third doped regions lying on the central regions, wherein the third doped regions have the second conductivity type;
   a first dielectric layer lying adjacent to sides of the pillars;
   spacers lying adjacent to the first dielectric layer, wherein the spacers act as floating gates;
   a second dielectric layer lying adjacent to the spacers;
   conductive members lying adjacent to the second dielectric layer, wherein one of the conductive members acts as gate electrodes for a third plurality of memory cells and as a word line for the memory array; and
   interconnects that are electrically connected to the third doped regions, wherein:
      one of the interconnects is electrically connected to the third doped regions of a fourth plurality of memory cells and acts as a bit line for the memory array; and
      only one memory cell is common to the third and fourth pluralities of memory cells.

* * * * *

UNITED STATES PATENT AND TRADEMARK OFFICE
CERTIFICATE OF CORRECTION

PATENT NO. : 5,483,094
DATED : January 9, 1996
INVENTOR(S) : Umesh Sharma It is certified that error appears in the above-identified patent and that said Letters Patent is hereby corrected as shown below:

On the title page, item [75] Inventors:
Remove Hisao Kawasaki as an inventor

Signed and Sealed this

Twenty-fourth Day of September, 1996

*Attest:*

BRUCE LEHMAN

*Attesting Officer*     *Commissioner of Patents and Trademarks*